US012736559B2

(12) United States Patent
Shi et al.

(10) Patent No.: US 12,736,559 B2
(45) Date of Patent: Sep. 15, 2026

(54) TEST SOCKET FOR 224GBPS ULTRA-HIGH-SPEED COAXIAL TESTING

(71) Applicant: SOLARIS NANOFAB LTD., Suzhou (CN)

(72) Inventors: Yuanjun Shi, Suzhou (CN); Lanyong Yin, Suzhou (CN); Kai Liu, Suzhou (CN); Yingdong Ji, Suzhou (CN)

(73) Assignee: SOLARIS NANOFAB LTD., Suzhou (CN)

( * ) Notice: Subject to any disclaimer, the term of this patent is extended or adjusted under 35 U.S.C. 154(b) by 189 days.

(21) Appl. No.: 18/668,070

(22) Filed: May 17, 2024

(65) Prior Publication Data

US 2025/0020688 A1 Jan. 16, 2025

Related U.S. Application Data

(63) Continuation of application No. PCT/CN2023/131696, filed on Nov. 15, 2023.

(30) Foreign Application Priority Data

Jul. 14, 2023 (CN) ........................ 202310868018.2

(51) Int. Cl.
*G01R 1/04* (2006.01)
*G01R 31/28* (2006.01)

(52) U.S. Cl.
CPC ....... *G01R 1/0466* (2013.01); *G01R 31/2886* (2013.01)

(58) Field of Classification Search
CPC ... G01R 1/0466; G01R 31/2886; G01R 1/045
See application file for complete search history.

(56) References Cited

U.S. PATENT DOCUMENTS

2013/0293254 A1* 11/2013 Chen .................. G01R 31/2887 324/756.02
2015/0241478 A1* 8/2015 Davis ................. G01R 31/2817 324/754.18

(Continued)

FOREIGN PATENT DOCUMENTS

CN 203606461 U 5/2014
CN 110726918 A 1/2020

(Continued)

*Primary Examiner* — Lee E Rodak
*Assistant Examiner* — Zannatul Ferdcus
(74) *Attorney, Agent, or Firm* — Rondaus PLLC; George Liu

(57) ABSTRACT

A test socket for 224 Gbps ultra-high-speed coaxial testing includes a test socket body made of metal and a test socket cover plate. The test socket body is provided with mounting holes, within which are set first polymer positioning parts that match the holes. The first polymer positioning part is provided with first and second insertion holes, into which test probes are respectively inserted. The test socket cover plate is fixedly provided with a second polymer positioning part, which has a first positioning hole that matches the first polymer positioning part, and a second positioning hole that is connected to the first positioning hole and matches the end of the test probe. The height of the first polymer positioning part is less than the length of the test probe, achieving a large dynamic bandwidth and high isolation for the coaxial test socket for ultra-high-speed testing frequencies.

9 Claims, 2 Drawing Sheets

(56) References Cited

U.S. PATENT DOCUMENTS

| | | | | |
|---|---|---|---|---|
| 2020/0227020 | A1* | 7/2020 | Landig | G10K 11/1785 |
| 2021/0088574 | A1* | 3/2021 | Shi | G01R 1/0466 |
| 2021/0122902 | A1* | 4/2021 | Hu | C08H 8/00 |
| 2022/0200178 | A1* | 6/2022 | Cheng | H01R 12/7082 |

FOREIGN PATENT DOCUMENTS

| | | | |
|---|---|---|---|
| CN | 110726918 | B | 4/2022 |
| CN | 114665334 | A | 6/2022 |
| JP | 2005149854 | A | 6/2005 |
| TW | I673499 | B | 10/2019 |

* cited by examiner

TEST SOCKET FOR 224GBPS ULTRA-HIGH-SPEED COAXIAL TESTING

CROSS REFERENCE TO RELATED APPLICATIONS

The present application is a Continuation Application of PCT Application No. PCT/CN2023/131696 filed on Nov. 15, 2023, which claims the benefit of Chinese Patent Application No. 202310868018.2 filed on Jul. 14, 2023. All the above are hereby incorporated by reference in their entirety.

TECHNICAL FIELD

This application relates to the field of chip test sockets, specifically to a test socket for 224 Gbps ultra-high-speed coaxial testing.

BACKGROUND ART

With the promotion and application of silicon photonics chips and the next generation of PCIE (Express) electrical interfaces, the market demand for coaxial test sockets is increasing, and higher bandwidth requirements for coaxial test sockets are being proposed. The past bandwidths of 45G or 50G are clearly not suitable for ultra-high-speed PAM4 test requirements such as 224 Gbps.

To date, there are mainly two different technical routes for the production methods of coaxial test sockets on the market. The first is by injecting glue into the socket body and later processing it to achieve signal matching impedance and power insulation functions. The second method is to put a Teflon ring around the central area of the probe to meet the requirements of insulation and impedance matching, as disclosed in CN 203606461 U "Coaxial Semiconductor Testing Device" and CN 110726918 B "Impedance Matching Structure of Semiconductor Chip Test Coaxial Socket and Its Preparation Method".

However, the existing coaxial solutions all have the following problems: First, they are completed through a single-hole design, and then the differential impedance matching is calculated by combining the impedance of the double needles. Therefore, because the probe is tightly wrapped by the surrounding electromagnetic field, the physical size of the probe will be compressed to be quite small to complete the impedance matching. This situation is not obvious when the pin pitch is 0.8 mm, but when the chip pin pitch changes to 0.4 mm or 0.35 mm, this change in size becomes extremely significant. Second, the dielectric constant of the glue used in the glue filling process is relatively large, and at the same time, it is unstable at high frequencies, which causes the corresponding test socket to drift in final test performance. Finally, whether it is secondary processing or the practice of plugging a ring on the probe will seriously interfere with the assembly accuracy and processing difficulty, thereby increasing the product's manufacturing cost and related yield rate.

SUMMARY

The main purpose of this application is to provide a test socket for 224 Gbps ultra-high-speed coaxial testing, achieving a large dynamic bandwidth and high isolation for the coaxial test socket for ultra-high-speed testing frequencies.

To achieve the above objectives, on the first aspect, this application provides a test socket for 224 Gbps ultra-high-speed coaxial testing, which includes a test socket body made of metal and a test socket cover plate. The test socket body is provided with mounting holes, within which are set first polymer positioning parts that match the holes. The first polymer positioning part is provided with first and second insertion holes, into which test probes are respectively inserted. The test socket cover plate is fixedly provided with a second polymer positioning part, which has a first positioning hole that matches the first polymer positioning part, and a second positioning hole that is connected to the first positioning hole and matches the end of the test probe. The height of the first polymer positioning part is less than the length of the test probe.

Further improvements include that the first polymer positioning part is formed by injection molding or extrusion.

Further improvements include that the first polymer positioning part is connected to the test socket body through stamping, plugging, or physical snap-fitting.

Further improvements include that the second polymer positioning part is fixedly connected to the first positioning hole through a sequence of rolling, stamping, glue filling, and hole filling.

Further improvements include that the glue used for filling includes epoxy resin doped with Teflon particles and/or air particles.

Further improvements include that the mounting holes, the first polymer positioning part, and the first positioning hole are waist-shaped.

Further improvements include that the second positioning hole is a cylindrical stepped hole.

Further improvements include that the test socket body and the test socket cover plate are fixedly connected by fasteners.

Further improvements include that the test socket body includes a first body and a second body, the first body is fixedly connected to the end of the test probe and is provided with chip solder balls, the second body is fixedly connected to the first body, and the mounting hole is provided on the second body.

Further improvements include that the first polymer positioning part is an impedance matching polymer, and the second polymer positioning part is an insulating polymer.

Compared with the existing technology, the beneficial effects are: first, the differential signal probes and the metal socket body as well as the two probes themselves form related coupling and matching, thus obtaining higher bandwidth and larger mechanical size. The high-frequency bandwidth is greater than 110 GHz with a return loss lower than −20 dB@80 GHz, which can support a digital rate of 224 Gbps.

Second, a more excellent low dielectric constant is used as the medium (2.1 to 2.2), such as Teflon, but not limited to Teflon, which increases the freedom of mechanical design.

Third, more insulating materials provide strong mechanical support, thereby significantly improving the overall socket's mechanical stability and extending its practical life. At the same time, the probe is more stable in the slot.

Fourth, the dielectric constant of the medium doped with Teflon particles and/or air particles can reach between 2.4 and 2.8.

BRIEF DESCRIPTION OF THE DRAWINGS

The drawings that form a part of this application are intended to provide further understanding of the application, making other features, objectives, and advantages of the application more apparent. The schematic implementation example drawings of this application and their descriptions are used to explain the application and do not constitute an improper limitation of the application. In the drawings.

Figure 1:
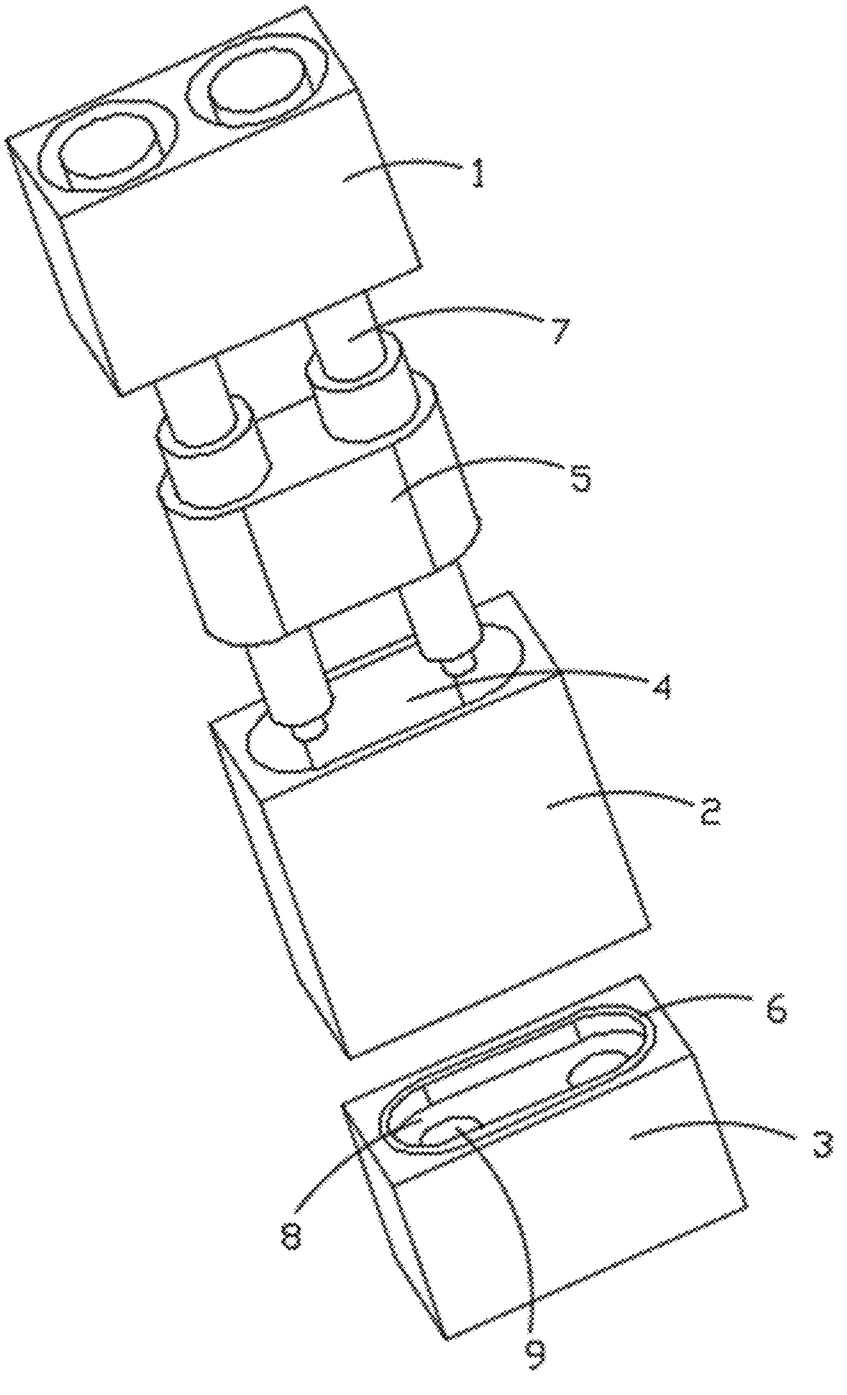
FIG. 1 is a schematic diagram of the disclosure.

wherein: first body 1; second body 2; test socket cover plate 3; mounting hole 4; first polymer positioning part 5; second polymer positioning part 6; test probe 7; first positioning hole 8; second positioning hole 9.

DETAILED DESCRIPTION OF EMBODIMENTS

To enable those skilled in the art to better understand the solutions of this application, the technical solutions in the embodiments of this application will be clearly and completely described below in conjunction with the drawings in the embodiments of this application. Obviously, the described embodiments are only a part of the embodiments of this application, not all embodiments. Based on the embodiments in this application, all other embodiments obtained by those skilled in the art without creative efforts should fall within the scope of protection of this application.

It should be noted that in the specification and claims of this application and the above drawings, the terms "first," "second," etc., are used to distinguish similar objects, not necessarily to describe a specific order or sequence. It should be understood that such data can be interchanged under appropriate circumstances to describe the embodiments of the application herein. Furthermore, the terms "comprising" and "having," and any variations thereof, are intended to cover a non-exclusive inclusion, such as a process, method, system, product, or device that includes a series of steps or units not necessarily limited to those clearly listed, but may include other steps or units not clearly listed or inherent to these processes, methods, products, or devices.

In this application, the terms "up," "down," "left," "right," "front," "back," "top," "bottom," "inside," "outside," "center," "vertical," "horizontal," "transverse," "longitudinal," etc., indicate orientation or positional relationships based on the orientation or positional relationships shown in the drawings. These terms are primarily for better description of the application and its embodiments and are not intended to limit the indicated device, component, or part to a specific orientation or to be constructed and operated in a specific orientation.

Moreover, the above terms, in addition to indicating orientation or positional relationships, may also be used to indicate other meanings, for example, the term "up" may also be used to indicate a certain attachment relationship or connection relationship in some cases. Those skilled in the art can understand the specific meanings of these terms in this application according to the specific circumstances.

Additionally, the term "multiple" should mean two or more.

It should be noted that, where not conflicting, the embodiments of this application and features within the embodiments can be combined with each other. The following will refer to the drawings and combine the embodiments to detail the application.

Figure 2:
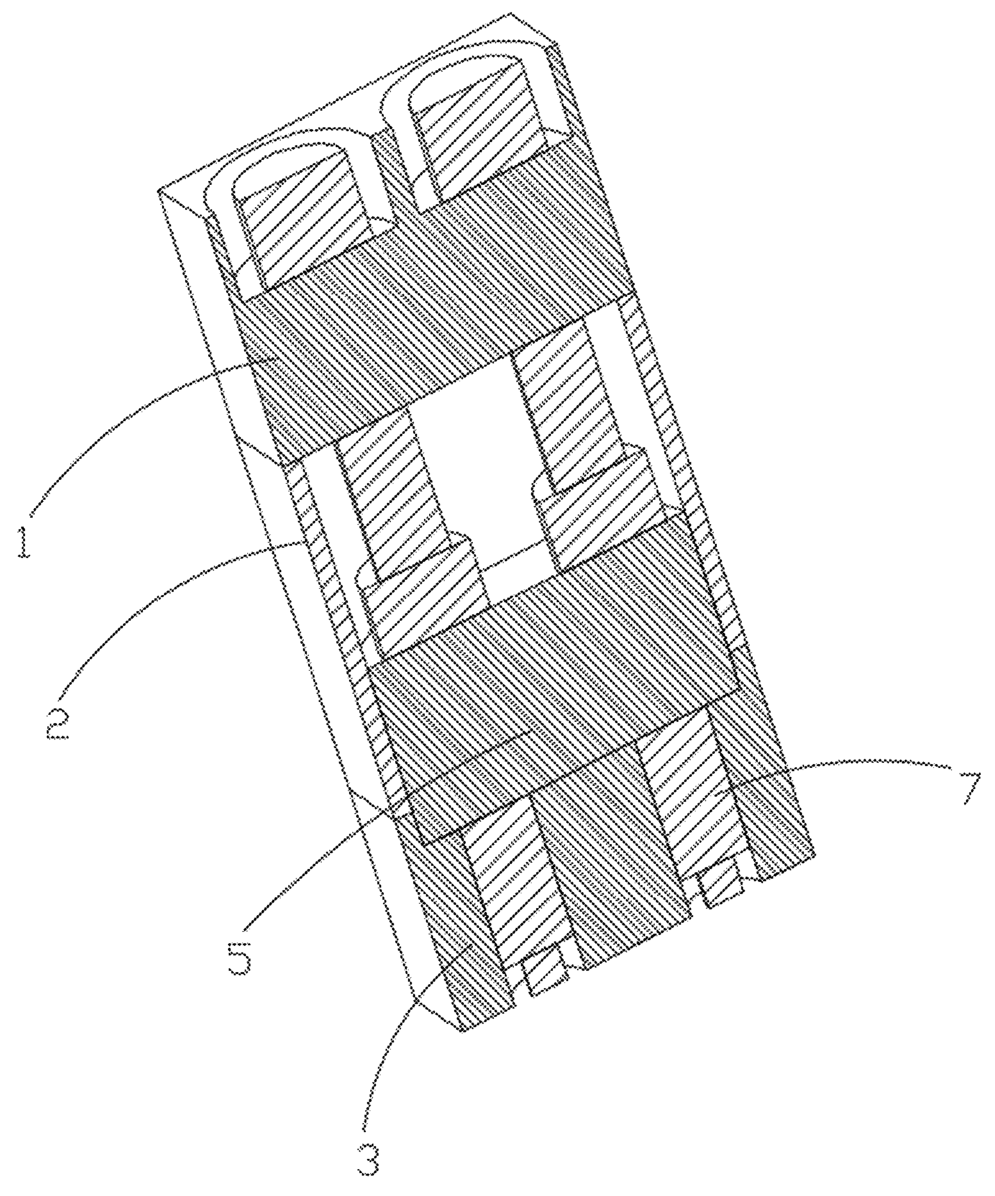
FIG. 2 is a cross-sectional view of the disclosure.

As shown in FIGS. 1 and 2, a test socket for 224 Gbps ultra-high-speed coaxial testing includes a test socket body made of metal and a test socket cover plate 3. The test socket body is provided with mounting holes 4, within which are set first polymer positioning parts 5 that match the holes. The first polymer positioning part 5 is provided with first and second insertion holes, into which test probes 7 are respectively inserted. The test socket cover plate 3 is fixedly provided with a second polymer positioning part 6, which has a first positioning hole 8 that matches the first polymer positioning part 5, and a second positioning hole 9 that is connected to the first positioning hole 8 and matches the end 15 of the test probe 7. The height of the first polymer positioning part 5 is less than the length of the test probe 7.

Preferably, the first polymer positioning part 5 is an impedance matching polymer, and the second polymer positioning part 6 is an insulating polymer.

Using two insertion holes of the same shape, namely the first and second insertion holes, two identical test probes 7 are installed, with the space between the two holes being the impedance matching polymer positioning part, which is the first polymer positioning part 5. The two holes as a whole are surrounded by conductive metal, mutually coupling with each other, shielding external signals, and thus no ground metal is set between the two differential signal transmission probes, only insulators are used for isolation, thereby maximizing the coupling transmission between differential signals and enhancing the accuracy of signal transmission.

From the structure of the transmission line, the structure of the present disclosure achieves impedance continuity at the connection part, with the metal test socket body serving as a high-frequency signal return path. The dual-pin dual-hole design increases the probe diameter and achieves higher test bandwidth, lower insertion, and return loss. In other words, it achieves better return loss and insertion loss than previous coaxial sockets. Therefore, it realizes low loss of circuit signals and miniaturization of the overall structure size. The aforementioned dielectric components are excited in the TM mode, and in the TM mode resonator, because the electric field is oriented towards the long side of the dielectric component, coupling with the transmission line is easily achieved.

The said first polymer positioning part 5 is formed by injection molding or extrusion, and it is connected to the test socket body through embossing, plug-in, or physical snap-fit, providing strong mechanical support, thereby significantly enhancing the mechanical stability of the overall socket and improving its practical lifespan. At the same time, the probe is more stable in the slot, and the dual-action needle design combined with the dual-hole design achieves better mechanical stability.

Preferably, the second polymer positioning part 6 is fixedly connected to the first positioning hole 8 successively through rolling, embossing, glue filling, and hole filling, and the glue used for filling includes epoxy resin doped with Teflon particles or air particles, adjusting the corresponding dielectric constant between (2.2 to 3.5).

As shown in FIG. 1, for better positioning to obtain mechanical stability, in this embodiment, the mounting hole 4, the first polymer positioning part 5, and the first positioning hole 8 are preferably waist-shaped, and the second positioning hole 9 is a cylindrical stepped hole. Impedance-matched polymer positioning parts house two probes transmitting differential pair signals, and insulating polymer positioning parts house a single probe transmitting single-ended signals.

In this embodiment, the test socket body is preferably fixedly connected to the test socket cover plate 3 by fasteners, which can be bolts, screws, etc.

As shown in FIGS. 1 and 2, in this embodiment, the test socket body preferably includes a first body 1 and a second body 2, the first body 1 is fixedly connected to the end of the test probe and is equipped with chip solder balls, and the second body 2 is fixedly connected to the first body 1, and the mounting hole 4 is provided on the second body 2.

Traditional coaxial test sockets are designed with a single hole position, using 2 single holes combined into a differential signal. This disclosure uses a dual-hole position design to make coaxial sockets, allowing for mutual coupling between differential signals to achieve better bandwidth and transmission rate. This allows the differential signals Positive and Negative to reference each other. At the same time, the dual-hole position impedance-matched polymer and insulating polymer make the socket's mechanical structure more stable.

To highlight the advantages of the dual-hole position coaxial socket, CN110726918A discloses an impedance-matched structure of a semiconductor chip test coaxial socket and its manufacturing method, which introduces a single-hole socket using impedance-matched polymer and insulating polymer. Tests have proven that this test socket can achieve an insertion loss of −1 dB/40 GHz and a return loss of −10 dB/40 GHz. However, using the dual-hole position coaxial socket in this embodiment, the return loss is lower than −20 dB@80 GHz, thereby its return loss is significantly better than the single-hole single-pin structure.

The above description is only the preferred embodiment of this application and is not intended to limit this application. For those skilled in the art, this application can have various changes and variations. Any modification, equivalent replacement, improvement, etc., made within the spirit and principles of this application should be included within the protection scope of this application.

The invention claimed is:

1. A test socket for 224 Gbps ultra-high-speed coaxial testing, wherein it includes a test socket body made of metal and a test socket cover plate (3), wherein the test socket body is provided with mounting holes (4), within which are set first polymer positioning parts (5) that match the holes; the first polymer positioning part (5) is provided with first and second insertion holes, into which test probes (7) are respectively inserted; the test socket cover plate (3) is fixedly provided with a second polymer positioning part (6), which has a first positioning hole (8) that matches the first polymer positioning part (5), and a second positioning hole (9) that is connected to the first positioning hole (8) and matches the end of the test probe (7); the height of the first polymer positioning part (5) is less than the length of the test probe (7);

wherein the test socket body includes a first body (1) and a second body (2), the first body (1) is fixedly connected to the end of the test probe and is provided with chip solder balls, the second body (2) is fixedly connected to the first body (1), and the mounting hole (4) is provided on the second body (2).

2. The test socket for 224 Gbps ultra-high-speed coaxial testing according to claim 1, wherein the first polymer positioning part (5) is formed by injection molding or extrusion.

3. The test socket for 224 Gbps ultra-high-speed coaxial testing according to claim 2, wherein the first polymer positioning part (5) is connected to the test socket body through stamping, plugging, or physical snap-fitting.

4. The test socket for 224 Gbps ultra-high-speed coaxial testing according to claim 1, wherein the second polymer positioning part (6) is fixedly connected to the first positioning hole (8) through a sequence of rolling, stamping, glue filling, and hole filling.

5. The test socket for 224 Gbps ultra-high-speed coaxial testing according to claim 4, wherein the glue used for filling includes epoxy resin doped with Teflon particles and/or air particles.

6. The test socket for 224 Gbps ultra-high-speed coaxial testing according to claim 1, wherein the mounting holes (4), the first polymer positioning part (5), and the first positioning hole (8) are waist-shaped.

7. The test socket for 224 Gbps ultra-high-speed coaxial testing according to claim 6, wherein the second positioning hole (9) is a cylindrical stepped hole.

8. The test socket for 224 Gbps ultra-high-speed coaxial testing according to claim 1, wherein the test socket body and the test socket cover plate (3) are fixedly connected by fasteners.

9. The test socket for 224 Gbps ultra-high-speed coaxial testing according to claim 1, wherein the first polymer positioning part (5) is an impedance matching polymer, and the second polymer positioning part (6) is an insulating polymer.

* * * * *